ELECTRODES TO SEMICONDUCTOR WAFERS

Filed June 29, 1962

INVENTOR
R. SCHMIDT
BY
Arthur J. Torsiglieri
ATTORNEY

United States Patent Office 3,239,376

Patented Mar. 8, 1966

3,239,376
ELECTRODES TO SEMICONDUCTOR WAFERS

Rudolf Schmidt, Warren Township, Somerset County, N.J., assignor to Bell Telephone Laboratories, Incorporated, New York, N.Y., a corporation of New York Filed June 29, 1962, Ser. No. 206,241
1 Claim. (Cl. 117—212)

This invention relates to semiconductor translating devices and electrical connections thereto.

Gold and aluminum are known to be desirable materials for making electrical connections to semiconductors. Frequently it is desirable to bond a gold lead to an alloyed aluminum contact or electrode, for example, as in the case of the emitter of an alloyed emitter diffused base germanium transistor. However, when these metals are used together in this fashion, the resulting electrodes frequently exhibit varying impedances and often fracture, destroying the efficacy of the device.

It has been discovered that these device failings are a consequence, for example in the case of an alloyed emitter diffused base germanium transistor, of the formation during operation of a gold-aluminum-germanium (and probably) oxygen compound occasioned by the presence of elemental gold and elemental aluminum in the proximity of the germanium surface. The formation of this compound takes place slowly by way of a surface reaction initiated after the completion of the device.

Accordingly, an object of this invention is to avoid the formation of such compounds.

A more specific object is to minimize the presence of elemental metals at the germanium surface of a completed device.

The crux of this invention lies in applying over the unalloyed aluminum layer left on the surface, after some of the aluminum deposited has been alloyed with the semiconductor, an amount of palladium or gold more than sufficient for converting, when heated, all the unalloyed aluminum to the stable aluminum intermetallic compound heretofore thought detrimental by workers skilled in the art. In this manner, the unalloyed aluminum is rendered unavailable for further compound formation while a suitable surface for the bonding of the wires serving as leads is maintained.

Accordingly, in one specific embodiment, in the fabrication of the emitter of an alloyed emitter diffused base germanium transistor, a layer of palladium is deposited over the aluminum and all the unalloyed aluminum is converted to a stable aluminum-palladium intermetallic compound. The excess palladium included provides a desirable surface for the bonding of leads and the detrimental compound formation is obviated.

In another embodiment an overlayer of gold is deposited instead of the palladium layer, the gold layer being of sufficient thickness for forming a gold-aluminum intermetallic compound involving all the unalloyed aluminum.

The invention and its objects and features will be understood more fully and clearly in light of the following description rendered in conjunction with the accompanying drawing, wherein.

It is to be understood that the figures are not necessarily to scale, certain dimensions being exaggerated for illustrative purposes only.

Figure 1:
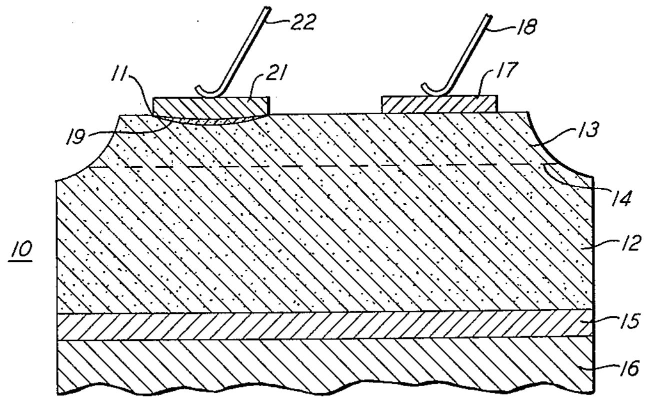
FIG. 1 is a schematic projection partially in cross section of a diffused base germanium transistor having an alloyed emitter to which the invention is applicable.

More specifically, FIG. 1 depicts a diffused base germanium transistor 10 having an alloyed emitter 11 which can be formed in accordance with this invention. The body of the transistor comprises a bulk portion 12 typically of P-type conductivity and a mesa portion 13 largely of N-type conductivity forming the collector junction 14 therebetween. The bulk portion 12 corresponds to the collector region of the transistor and electrical connection is made thereto by low resistance contact 15. Typically, contact 15 is a gold plating on the header 16 to which the transistor is mounted. Most of mesa portion 13 corresponds to the base region of the transistor and electrical connection is made thereto by low resistance contact 17 and lead wire 18. A surface portion 19 of mesa portion 13 serves as the emitter region and electrical connection thereto is made by the contact 21 and the lead wire 22. The emitter region 19 is formed as a consequence of alloying therein some of the material originally part of contact 21.

Figure 2:
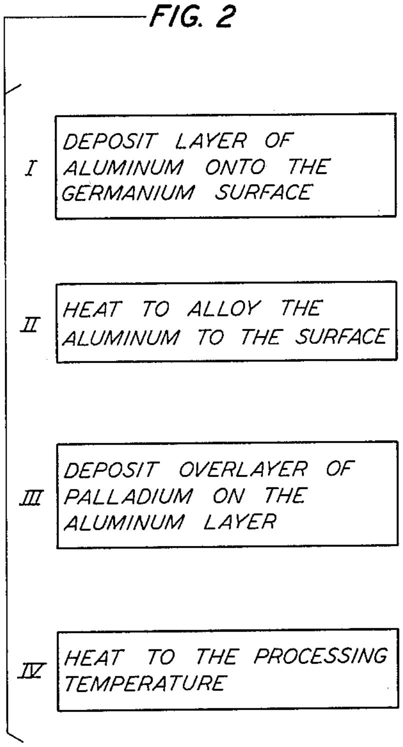
FIG. 2 is a block diagram of the sequence of the steps of a process in accordance with this invention.

FIG. 2 is a block diagram of the sequence of steps of a process in accordance with this invention particularly as utilized for fabricating the alloyed emitter 11. It should be evident however that the technique is useful in fabricating a low resistance contact. A low resistance contact would be made if the contacted semiconductor had been P-type.

Figure 3:
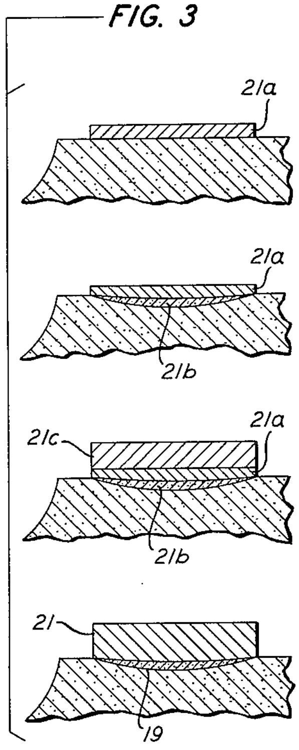
FIG. 3 is a series of cross-sectional views of an electrode and underlying emitter of the transistor of FIG. 1 during the fabrication thereof, each view corresponding to that juncture in the fabrication called for by the corresponding block of FIG. 2.

Block I of FIG. 2 calls for depositing a layer of aluminum onto the germanium surface, which will be N-type when used to form an emitter. Such a deposition is accomplished conveniently by evaporating the aluminum through an evaporation mask resulting in an aluminum layer 21*a* of FIG. 3 having surface dimensions corresponding to the dimensions of the aperture in the evaporation mask and a thickness which is a function of the evaporation parameters. This structure is heated, as called for in block II, temporarily to above the aluminum-germanium eutectic temperature of 424 degrees centigrade for alloying the aluminum layer to the germanium. The result of the heating step is shown in FIG. 3 where the layer 21*a* after the heating step is shown as being of diminished thickness. The remainder of the aluminum is consumed in forming the alloyed region 21*b* which will be P-type. Block III calls for the deposition of a palladium layer over the aluminum layer. This step typically is carried out by evaporating techniques similar to those employed in the evaporation of the aluminum. FIG. 3 shows the palladium layer 21*c* and the resulting lamellate structure of the contact in accordance with this invention prior to the subsequent heating step. Block IV calls for heating this lamellate structure for intermixing the layers of aluminum and palladium, resulting in an electrode 21 composed of an intermetallic compound of these metals and excess palladium, but free of any elemental aluminum.

In one specific embodiment of this invention the portion of the germanium wafer contacted was of N-type conductivity including about $10^{18}$ antimony atoms/cm.$^3$. The layer of aluminum was initially about 1,500 Angstrom units thick and the layer of palladium was initially about 3,000 Angstrom units thick. On heating this assembly, an electrode containing predominantly PdAl was formed. However, other stable intermetallics such as $PdAl_3$ and $Pd_2Al_3$ also were present in small quantities.

This embodiment which was a germanium diffused base transistor was fabricated as follows. A germanium wafer about one inch in diameter and .012 inch thick was the starting material. The wafer included a uniform concentration of gallium and exhibited a P-type resistivity of 0.5 ohm-centimeter. Antimony was then diffused into a surface of the wafer by well known diffusion techniques to form an N-type diffused region on one surface. A 1,500 Angstrom unit thick layer of aluminum was evaporated onto a localized portion about .001 inch wide and .006 inch long of this diffused surface. The coated wafer then was heated to about 430 degrees centigrade for about three minutes for alloying the aluminum to the germanium and for forming a P-type emitter in the N-type diffused region. After heating, there was left a layer of unalloyed aluminum on the surface. Then a 3,000 Angstrom unit thick layer of palladium was evaporated to cover the unalloyed aluminum layer. The wafer then was heated to about 430 degrees centigrade for about three minutes to convert the aluminum to a palladium-aluminum intermetallic compound. A gold wire was connected by way of a gold contact .001 by .006 inch to the exposed N-type portion of the same surface by conventional means for forming the low resistance base connection and a gold layer was deposited on the opposite P-type surface for forming the collector connection. The mesa, about .005 by .008 inch, was formed on the diffused surface by conventional etching techniques.

In practice it may be convenient to deposit the palladium over the aluminum prior to any alloying. Under these conditions a certain amount of aluminum will alloy anyway before the intermetallic compound is formed.

The process has been found particularly useful also in forming both the low resistance emitter and base connections to double diffused silicon transistors.

It is important that the overlayer employed in the formation of an electrode or contact in accordance with this invention include at least sufficient palladium atoms to convert all the available aluminum atoms to a stable intermetallic compound. In practice it is advantageous to supply excess palladium to produce a particularly desirable bonding surface to which the emitter lead wire can be connected. Accordingly, a palladium layer is applied which exceeds the thickness of the aluminum layer by at least 50 percent and is typically twice as thick. For example, in the specific embodiment described, a layer of palladium 3,000 Angstrom units thick was found advantageous for this purpose when used with a layer of aluminum 1,500 Angstrom units thick.

The above described embodiments are susceptible of numerous and varied modifications, all clearly within the spirit and scope of the principles of the present invention, as will be apparent to those skilled in the art. In particular, as previously indicated, gold may be used instead of palladium as the overlayer material.

What is claimed is:

In the process of forming an electrical connection, which includes a gold wire lead, to a semiconductor wafer selected from the group consisting of germanium and silicon, the steps of depositing on at least a portion of the surface of the wafer a layer of aluminum, heating said wafer to a temperature of at least the eutectic temperature of aluminum and said semiconductor for a period of time sufficient to alloy some of the aluminum layer with the semiconductor, depositing on said portion a second layer of a metal selected from the group consisting of gold and palladium, said second layer having a thickness at least 50 percent greater than said aluminum layer, heating the wafer to a temperature of at least the eutectic temperature of aluminum and said semiconductor for a period of time sufficient to cause substantially all of said unalloyed aluminum layer to combine with said adjoining metal and semiconductor materials.

References Cited by the Examiner

UNITED STATES PATENTS

| | | | |
|---|---|---|---|
| 2,861,018 | 11/1958 | Fuller et al. | |
| 2,861,230 | 11/1958 | Le Loup. | |
| 2,877,147 | 3/1959 | Thurmond | 148—1.5 |
| 2,878,432 | 3/1959 | Armstrong et al. | 148—1.5 |
| 2,906,932 | 9/1959 | Fedotowsky et al. | |
| 2,959,505 | 11/1960 | Riesz. | |
| 2,992,947 | 7/1961 | Gotzberger. | |
| 2,995,475 | 8/1961 | Sharpless. | |

JOSEPH B. SPENCER, *Primary Examiner.*

DAVID L. RECK, RICHARD D. NEVIUS, *Examiners.*